United States Patent
Hasegawa et al.

(10) Patent No.: US 7,033,843 B2
(45) Date of Patent: Apr. 25, 2006

(54) SEMICONDUCTOR MANUFACTURING METHOD AND SEMICONDUCTOR MANUFACTURING APPARATUS

(75) Inventors: Hiroyuki Hasegawa, Tokyo (JP); Tomonori Yamaoka, Tokyo (JP); Yoshio Ishihara, Tokyo (JP); Hiroshi Masusaki, Tokyo (JP)

(73) Assignee: Taiyo Nippon Sanso Corporation, Tokyo (JP)

( * ) Notice: Subject to any disclaimer, the term of this patent is extended or adjusted under 35 U.S.C. 154(b) by 26 days.

(21) Appl. No.: 10/696,702

(22) Filed: Oct. 30, 2003

(65) Prior Publication Data

US 2004/0092043 A1    May 13, 2004

Related U.S. Application Data

(62) Division of application No. 10/254,601, filed on Sep. 26, 2002, now Pat. No. 6,794,204, which is a division of application No. 09/793,124, filed on Feb. 27, 2001, now Pat. No. 6,776,805.

(30) Foreign Application Priority Data

Feb. 28, 2000  (JP)  .............................. 2000-052519
Apr. 10, 2000  (JP)  .............................. 2000-108563

(51) Int. Cl.
  *G01R 31/26*  (2006.01)
(52) U.S. Cl. .............................. 438/11; 438/12; 438/16
(58) Field of Classification Search .................... 438/6, 438/115, 773, 663, 680, 770, 778, 787, 795, 438/723, 716; 356/437, 72; 156/345, 346
See application file for complete search history.

(56) References Cited

U.S. PATENT DOCUMENTS

| | | | |
|---|---|---|---|
| 3,732,435 A | 5/1973 | Strandberg et al. | ......... 307/118 |
| 4,222,044 A | 9/1980 | Boschung | .................... 340/581 |
| 4,272,986 A | 6/1981 | Lowry et al. | .................. 73/73 |
| 4,475,080 A | 10/1984 | Walker | ........................ 324/640 |
| 4,661,196 A * | 4/1987 | Hockersmith et al. | . 156/345.31 |
| 4,869,301 A | 9/1989 | Ohmi et al. | .................. 141/85 |

(Continued)

FOREIGN PATENT DOCUMENTS

JP    60-145999    8/1985

(Continued)

*Primary Examiner*—Michael Lebentritt
*Assistant Examiner*—Andre' Stevenson
(74) *Attorney, Agent, or Firm*—Pillsbury Winthrop Shaw Pittman LLP

(57) ABSTRACT

A semiconductor manufacturing method whereby reactive gas processing such as selective epitaxial growth can be carried out with high precision by correctly adjusting conditions during processing is performed by a semiconductor manufacturing apparatus which can restrict increases in the moisture content, prevent heavy metal pollution and the like, and investigate the correlation between moisture content in the process chamber and outside regions. The moisture content in a reaction chamber and in a gas discharge system of the reaction chamber are measured when a substrate is provided, and the conditions for reactive gas processing are adjusted based on the moisture content. Furthermore, the moisture content in the airtight space is measured by a first moisture measuring device which is connected to the airtight space, and thereafter, the substrate is inserted and ejected by a substrate carrying system, and a reactive gas is processed while measuring the moisture content in the reaction chamber by a second moisture measuring device, which is connected to the reaction chamber, after the moisture content in the airtight space is measured.

8 Claims, 8 Drawing Sheets

U.S. PATENT DOCUMENTS

| | | | | |
|---|---|---|---|---|
| 5,100,495 | A | 3/1992 | Ohmi et al. | 156/345.26 |
| 5,241,851 | A | 9/1993 | Tapp et al. | 73/29.01 |
| 5,407,492 | A | 4/1995 | Ohmi et al. | 148/287 |
| 5,584,971 | A | 12/1996 | Komino | 204/192.13 |
| 5,716,495 | A | 2/1998 | Butterbaugh et al. | 438/708 |
| 5,749,521 | A | 5/1998 | Lattery | 239/64 |
| 5,844,125 | A | 12/1998 | Pillion | 73/29.01 |
| 5,953,591 | A * | 9/1999 | Ishihara et al. | 438/115 |
| 5,963,336 | A * | 10/1999 | McAndrew et al. | 356/437 |
| 6,154,284 | A * | 11/2000 | McAndrew et al. | 356/437 |
| 6,239,044 | B1 | 5/2001 | Kashiwagi et al. | 438/787 |
| 6,240,610 | B1 | 6/2001 | Ishihara et al. | 29/25.01 |
| 6,312,525 | B1 * | 11/2001 | Bright et al. | 118/719 |

FOREIGN PATENT DOCUMENTS

| | | |
|---|---|---|
| JP | 01216551 A | 8/1989 |
| JP | 03226649 A | 10/1991 |
| JP | 4085927 | 3/1992 |
| JP | 05-099845 | 4/1993 |
| JP | 6-61199 | 3/1994 |
| JP | 9129709 | 5/1997 |
| JP | 10-144581 | 5/1998 |
| JP | 10-335249 | 12/1998 |
| JP | 11-183366 | 7/1999 |
| JP | 200097890 A | 4/2000 |
| JP | 2000216102 | 8/2000 |

* cited by examiner

SEMICONDUCTOR MANUFACTURING METHOD AND SEMICONDUCTOR MANUFACTURING APPARATUS

This Application is a Divisional of U.S. application Ser. No. 10/254,601 filed Sep. 26, 2002 now U.S. Pat. No. 6,794,204, which is a Divisional of U.S. application Ser. No. 09/793,124 filed Feb. 27, 2001 now U.S. Pat. No. 6,776,805, which is pending, the entire contents of which are incorporated herein by reference.

BACKGROUND OF THE INVENTION

1. Field of the Invention

The present invention relates to a semiconductor manufacturing method which provides epitaxial growth and the like on the surface of a silicon substrate placed in, for example, a reaction chamber, by using reactive gas (corrosive gas).

2. Description of the Related Art

Manufacturing processes for providing a semiconductor circuit such as an LSI on a silicon substrate include selectively and epitaxially growing a silicon thin-film on the surface, providing a pattern comprising an $SiO_2$ film (silicon oxide) on the surface of a silicon substrate W, and epitaxially growing a silicon film in a region where the silicon is exposed, vapor-depositing a single-crystal silicon thin-film (epitaxial layer) having a predetermined concentration of impurity on a substrate for a MOS device comprising a silicon substrate having extremely low resistivity, and the like.

In these manufacturing processes, the silicon substrate is placed inside a process chamber and a reactive source gas is injected therein to grow the epitaxial layer on the substrate.

Other manufacturing processes using reactive gas include a variety of CVD processes for providing a thin-film on a substrate by the reaction of the reactive gas, and etching processes for providing micro-patterns, etc.

The reactive gas used in these semiconductor manufacturing apparatuses comprises a corrosive gas, such as ultra-high purity hydrogen chloride gas or ammonia gas. However, when the gas contains even a small amount of moisture, the metal components used in the apparatus (e.g. in the process chamber, gas supply system, gas discharge system, etc.) become susceptible to corrosion. This leads to hazardous pollution caused by metal (heavy metal) from the metallic sections. Consequently, there is a demand for a highly sensitive method for quantitative analysis of the moisture in corrosive gas inside the process chamber.

Conventionally, the only means of investigating the interrelation between processing conditions and heavy metal pollution, and the interrelation between processing conditions and the characteristics of the reactive gas processing, has been to feed back results obtained by directly analyzing a processed monitor wafer by using chemical analysis (atomic absorption spectrometry, radioactivation analysis, etc.), physical analysis (SIMS, TXRF, etc.), and electrical analysis (DLTS, SPV, lifetime, etc.).

In recent years, means for measuring the moisture content in reactive gas (corrosive gas) comprising a laser moisture measuring device which radiates laser light into the main body of a tube-like cell, connected to a process chamber, and measures the absorption spectrum of the transmitted light, has been proposed in, for example, Japanese Unexamined Patent Application, First Publication (Kokai), No. Hei 5-99845, Japanese Unexamined Patent Application, First Publication (Kokai), No. Hei 11-183366 and the like. Since the laser moisture measuring device can measure the gas without contact with the gas, it can measure even, reactive gas with high precision. Therefore, it has become possible to measure the moisture content inside the process chamber even during processing.

However, the conventional semiconductor manufacturing technology described above does not address the following problems. During the actual processing, the moisture content inside the process chamber is not always constant in each process. Even when conditions are set after feeding back the results of analysis of the process monitor wafer, fluctuation in the moisture content causes variation in the characteristics of the reactive gas processing. For example, in the case of the selective epitaxial growth already mentioned, the moisture (absorbed moisture) of the $SiO_2$ film may be removed during pre-processing baking of the substrate, whereby the moisture content inside the process chamber increases. In this case, the moisture content increases during selective epitaxial growth, affecting the characteristics of the selectability of the selective growth and the selectively deposited film.

Furthermore, the moisture within the process chamber does not come only from the reactive gas pipes, and may be caused by atmosphere seeping in from other outside regions. This also increases the moisture content, making it difficult to determine the cause of fluctuations in the moisture content merely by measuring the moisture content in the process chamber. Nor is it clear what level of moisture content within the process chamber will make it possible to adequately control the effects of heavy metal pollution. For example, as shown in FIG. 9, an investigation of the relationship between the recombination lifetime and the moisture of discharged gas during the reaction reveals that the lower the moisture content, the longer the lifetime. However, there is a considerable difference between the average lifetime (solid line) and the maximum lifetime (broken line). This is due to spots of heavy metal pollution on the surface of the substrate.

SUMMARY OF THE INVENTION

The present invention has been realized after consideration of the above problems. It is an object of this invention to provide a semiconductor manufacturing method whereby reactive gas processing, such as selective epitaxial growth, can be carried out with high precision by correctly adjusting conditions during processing.

It is another object of this invention to provide a semiconductor manufacturing method and a semiconductor manufacturing apparatus which can restrict increases in the moisture content, prevent heavy metal pollution and the like, and investigate the correlation between moisture content in the process chamber and outside regions.

In order to solve the problems mentioned above, the semiconductor manufacturing method according to a first aspect of this invention provides a semiconductor manufacturing method which performs reactive gas processing, the reactive gas being fed into a reaction chamber, into which a substrate is placed, and reacting with the substrate. The method comprises measuring the moisture content in the reaction chamber, into which the substrate is placed, and in a gas discharge system of the reaction chamber, and adjusting conditions for processing the reactive gas based on the moisture content In this semiconductor manufacturing method, the moisture content in the reaction chamber, into which the substrate is placed, and in a gas discharge system of the reaction chamber, is measured, and the conditions for processing the reactive gas are adjusted based on the moisture content. Therefore, it is possible to adjust the moisture content itself (correcting it to within an appropriate range) and conditions for film-formation, etching, and the like, based on the measurement of the moisture content during actual processing. This makes it possible to achieve highly precise and stable processing which takes into consideration the effects of moisture content on the characteristics of the reactive gas processing.

Preferably, in the semiconductor manufacturing method according to the first aspect of this invention, the conditions for processing the reactive gas should comprise conditions for heating the substrate prior to feeding the reactive gas into the reaction chamber.

In this semiconductor manufacturing method, the conditions for heating the substrate (baking conditions) are adjusted prior to feeding the reactive gas into the reaction chamber. Therefore, moisture in the substrate can be sufficiently removed prior to feeding the reactive gas into the reaction chamber, and the moisture content inside the reaction chamber can be adjusted to an appropriate level, and the like, thereby making the processing more stable.

The conditions for heating which are adjusted comprise at least one of the heating temperature of the substrate, the heating time of the substrate, and the amount of purge gas.

Preferably, in the semiconductor manufacturing method according to the first aspect of this invention, the conditions for processing the reactive gas should comprise at least one of the heating temperature of the substrate, the amount of the reactive gas, the mixture ratio of the reactive gas, and the pressure inside the reaction chamber.

Adjustment is made to at least one of the heating temperature of the substrate, the amount of the reactive gas, the mixture ratio of the reactive gas, and the pressure inside the reaction chamber. Since these conditions particularly affect the selectability of selective epitaxial growth, the selectability of the selective growth can consequently be increased.

Further, the semiconductor manufacturing method according to the first aspect of this invention comprises reactive gas processing of the substrate, which has silicon oxide provided on at least part of its top face.

In the case of the substrate which has silicon oxide provided on at least part of its top face, there is a danger that the moisture of the silicon oxide will be removed during baking, increasing the moisture content inside the reaction chamber. By measuring the moisture content, even this type of substrate can be processed with high precision and stability.

The semiconductor manufacturing method according to the first aspect of this invention is especially suitable in the case where the substrate comprises a silicon substrate, and the reactive gas processing comprises selectively growing a semiconductor layer in a region on the top face of the substrate where the silicon is exposed.

When selectively and epitaxially growing a semiconductor layer, such as a silicon layer, in a region on the top face of the substrate where the silicon is exposed, the selectability is affected by the moisture. Therefore, selective growth can be achieved with high precision and high selectability by adjusting the conditions based on the measured moisture content.

According to the semiconductor manufacturing method of the first aspect of this invention, the moisture content in the reaction chamber, into which the substrate is placed, and in the gas discharge system of the reaction chamber, is measured, and the conditions for processing the reactive gas are adjusted based on the moisture content. The moisture content itself and conditions for film-formation, etching, and the like, are adjusted based on the measurement of the moisture content during actual processing. Therefore, it is possible to achieve highly precise and stable processing which takes into consideration the effects of moisture content on the characteristics of the reactive gas processing. In particular, in selectively growing a semiconductor layer in a region on the top face of a silicon substrate, the selectability is affected by the moisture. Therefore, stable selective growth can be achieved with high selectability by adjusting the parameters (processing conditions such as heating temperature) which influence selectability, based on the measured moisture content.

The inventors researched the causes of increased moisture content in a reaction chamber, and measured the moisture content in an airtight space of the substrate carrying system, comprising a region outside the reaction chamber, when the substrate is carried into the reaction chamber. As shown in FIG. 10, it was discovered the moisture content in the reaction chamber increases in spite of the fact that the moisture content in the airtight space is decreasing (in FIG. 10, reference code Tr-ch represents data inside a carrying chamber (the airtight space), and Pr-ch represents data inside a processing chamber (reaction chamber)). It is believed that this is because the reaction chamber is heated beforehand to a predetermined temperature, and oxygen entering the airtight space from an outside section, such as a load lock, reacts with hydrogen in the reaction chamber, thereby generating moisture. The carrying system becomes a moisture supply source in addition to the reactive gas.

Based on this knowledge, a second aspect of this invention solves the problems mentioned above and comprises a semiconductor manufacturing method which performs reactive gas processing (corrosive gas processing), wherein, when a substrate carrying system inserts a substrate from an airtight space in the substrate carrying system into a reaction chamber, and when the substrate is ejected from the reaction chamber to the airtight space, reactive gas (corrosive gas) is fed into the reaction chamber and reacts therein. The method comprises a substrate carrying step of measuring the moisture content in the airtight space by means of a first moisture measuring device which is connected to the airtight space, and thereafter, inserting and ejecting the substrate by means of the substrate carrying system; and a gas processing step of performing the reactive gas processing while measuring the moisture content in the reaction chamber by means of a second moisture measuring device, which is connected to the reaction chamber, after the substrate carrying step.

Furthermore, a third aspect of this invention provides a semiconductor manufacturing apparatus for performing reactive gas processing (corrosive gas processing) when a substrate carrying system inserts a substrate from an airtight space in the substrate carrying system into a reaction chamber, and when the substrate is ejected from the reaction chamber to the airtight space. The semiconductor manufacturing apparatus feeds reactive gas (corrosive gas) into the reaction chamber and reacts the reactive gas therein. The semiconductor manufacturing apparatus comprises a first moisture measuring device, which measures the moisture content in the airtight space of the substrate carrying system, and a second moisture measuring device, which measures the moisture content in the reaction chamber.

In the semiconductor manufacturing method of the second aspect and the semiconductor manufacturing apparatus of the third aspect, a first moisture measuring device measures the moisture content in the airtight space of the substrate carrying system, and a second moisture measuring device measures the moisture content in the reaction chamber. Consequently, the moisture content in the airtight space of the substrate carrying system and the moisture content in the reaction chamber can be measured together, making it possible to investigate the effects of moisture content in the airtight space on the moisture content in the reaction chamber. In addition, the moisture content in the airtight space can be measured and reduced in order to reduce moisture content in the reaction chamber, achieving excellent gas processing.

Preferably, in the semiconductor manufacturing method according to the second aspect of this invention, the substrate carrying step comprises inserting the substrate from the airtight space to the reaction chamber or ejecting the substrate from the reaction chamber to the airtight space, after it has been confirmed that the moisture content in the airtight space is lower than a first default value. The gas processing step should preferably commence after it has been confirmed that the moisture content in the reaction chamber is lower than a second default value.

In this semiconductor manufacturing method, the maximum moisture content required in the airtight space when transporting the substrate inside or outside the reaction chamber is preset as a first default value, and the maximum moisture content required when carrying out reactive gas processing without heavy metal pollution and the like in the reaction chamber is preset as a second default value. Therefore, it is possible to achieve stable and excellent reactive gas processing.

In the semiconductor manufacturing method according to the second aspect of this invention, at least the second default value should preferably be lower than 1 ppm.

The inventors investigated the relationship between moisture content in the reaction chamber and heavy metal pollution. It was discovered that when the moisture content is of the order of ppm, spots of heavy metal pollution appeared on the surface of the substrate, but hardly any of these spots were generated when the moisture content was reduced to the order of sub-ppm. Therefore, the semiconductor manufacturing method of this invention is based on this knowledge, and prevents spots of heavy metal pollution by setting at least the second default value to less than 1 ppm.

In the semiconductor manufacturing method according to the second aspect of this invention and the semiconductor manufacturing apparatus according to the third aspect, at least one of the first moisture measuring device and the second moisture measuring device should preferably comprise a laser moisture measuring device which radiates laser light into a tubular cell main body, connected to the airtight space and the reaction chamber, and measures the absorption spectrum of transmitted laser light.

In the above semiconductor manufacturing method and semiconductor manufacturing apparatus, at least one of the first and second moisture measuring devices comprises a laser moisture measuring device. Therefore, the moisture of the gas to be measured can be quantitatively analyzed with high precision and without physical contact.

In a preferred arrangement of the semiconductor manufacturing apparatus according to the third aspect of this invention, a plurality of reaction chambers are provided, and the first moisture measuring device is capable of measuring the moisture content in each of the reaction chambers.

In this semiconductor manufacturing apparatus, the first moisture measuring device can measure the moisture content of a plurality of reaction chambers. Therefore, the reactive gas can be processed at a moisture content which is appropriate for each of the reaction chambers by measuring the moisture content of each reaction chamber.

Preferably, the semiconductor manufacturing apparatus of the third aspect of this invention further comprises a switching unit which can switch an object connected to the first moisture measuring device to any one of the reaction chambers.

This semiconductor manufacturing apparatus comprises a switching unit which can switch an object connected to the first moisture measuring device to any one of the reaction chambers. Therefore, when the switching unit connects the reaction chamber to be measured to the first moisture measuring device, it becomes possible to measure the moisture content in multiple or individual reaction chambers by using the single first moisture measuring device. Consequently, the number of components and the cost can be reduced.

Preferably, in the semiconductor manufacturing apparatus according to the third aspect of this invention, the first moisture measuring device and the second moisture measuring device comprise a single moisture measuring device, and the apparatus further comprises a switching unit which can switch an object connected to the moisture measuring device to the airtight space and the reaction chamber.

In this semiconductor manufacturing apparatus., a single moisture measuring device performs the functions of the first and second moisture measuring devices. The switching unit can switch the object connected thereto to the airtight space or the reaction chamber. Therefore., the moisture content in the airtight space and the reaction chamber can be measured by a single moisture measuring device, reducing the number of components and the cost.

According to the semiconductor manufacturing method of the second aspect of this invention and the semiconductor manufacturing apparatus of the third aspect, the first moisture measuring device measures the moisture content in the airtight space of the substrate carrying system, and the second moisture measuring device measures the moisture content in the reaction chamber. Consequently, the moisture content in the airtight space of the substrate carrying system and the moisture content in the reaction chamber can be measured together, making it possible to investigate the effects of moisture content in the airtight space on the moisture content in the reaction chamber. Therefore, the cause of moisture supplied from the substrate carrying system can be analyzed. Further, the moisture content in the airtight space can be measured and reduced in order to reduce moisture content in the reaction chamber, achieving excellent reactive gas processing. Therefore, reactive gas processing such as crystal growth, thin-film deposition, and etching, can be made excellent and more stable, and it becomes possible to manufacture a high-quality semiconductor manufacturing apparatus, such as a semiconductor substrate and a semiconductor device.

DETAILED DESCRIPTION OF THE INVENTION

Figure 1:
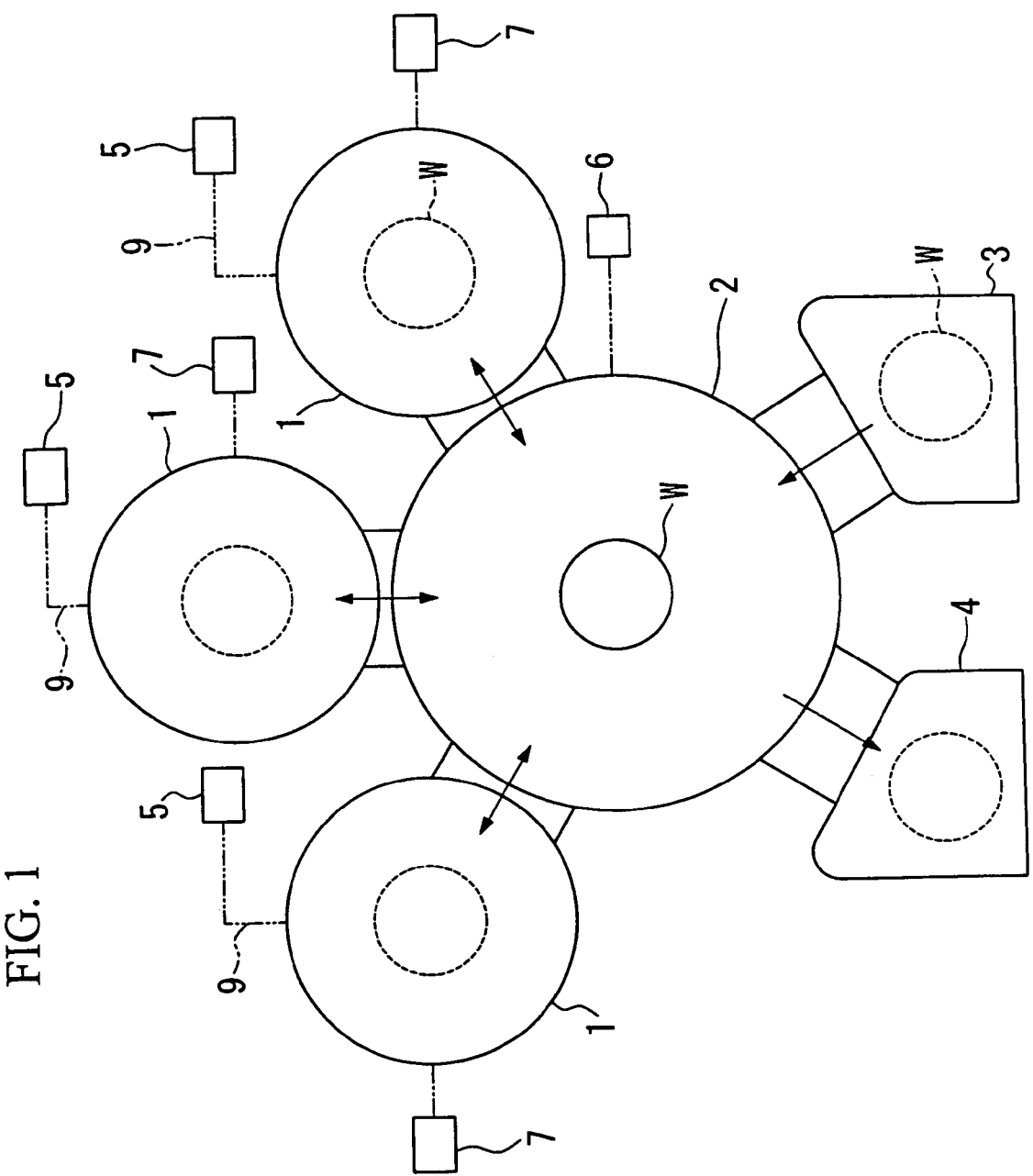
FIG. 1 is a schematic overall plan view of an epitaxial crystal growth apparatus in an embodiment of the semiconductor manufacturing method according to the present invention.

An embodiment of the semiconductor manufacturing method according to a first aspect of the present invention will be explained with reference to FIGS. 1 to 3.

In these diagrams, reference numeral 1 represents process chambers, 2 represents a carrying chamber, 3 represents an insertion load lock chamber, 4 represents an ejection load lock chamber, and 5 represents a moisture measuring device for processing.

FIG. 1 shows a leaf-type epitaxial crystal growth apparatus for realizing the semiconductor manufacturing method of the present invention. As shown in FIG. 1, the epitaxial crystal growth apparatus comprises three quartz process chambers (reaction chambers) 1, comprising hollow-body airtight enclosures inside which silicon substrates W are placed, a carrying chamber 2 having an inner gastight space whose atmosphere is replaced when the silicon substrates W are inserted into the process chambers 1, an insertion load lock chamber 3 which inserts the pre-process silicon substrates W into the carrying chamber 2, and an ejection load lock chamber 4 which extracts the processed silicon substrates W from the carrying chamber 2.

Each process chamber 1 has a moisture measuring device for processing 5 which samples the reactive gas which has been injected into the process chambers 1 and measures the moisture therein, and a pressure measuring device 7 which measures pressure inside the process chamber 1.

A carrying system moisture measuring device 6 is provided in the carrying chamber 2 and measures the moisture in the internal atmosphere. Preferably, the carrying system moisture measuring device 6 should comprise a laser moisture measuring device having the same main body as a high-precision rapid-response moisture measuring device main body 10, which will be described later. However, it is acceptable to use a static capacitance moisture measuring device which measures changes in the electrical capacitance of moisture absorbed in an aluminium capacitor or the like, or a moisture measuring device which uses qualitative analysis, or the like.

The process chambers 1 can be connected to a gas source (not shown in FIG. 1) which supplies reactive gas and the like, so that gas ($SiCl_2H_2$, $SiCl_3H$, $HCl$, $H_2$, $N_2$, $B_2H_6$, , $PH_3$, $SiH_4$, etc.) can be injected into the process chambers 1. In addition, the process chambers 1 can be connected via a gas discharge system to an exhaust gas processing unit (not shown), so that reactive gas and the like can be discharged thereto after reaction inside the process chambers 1.

Figure 2:
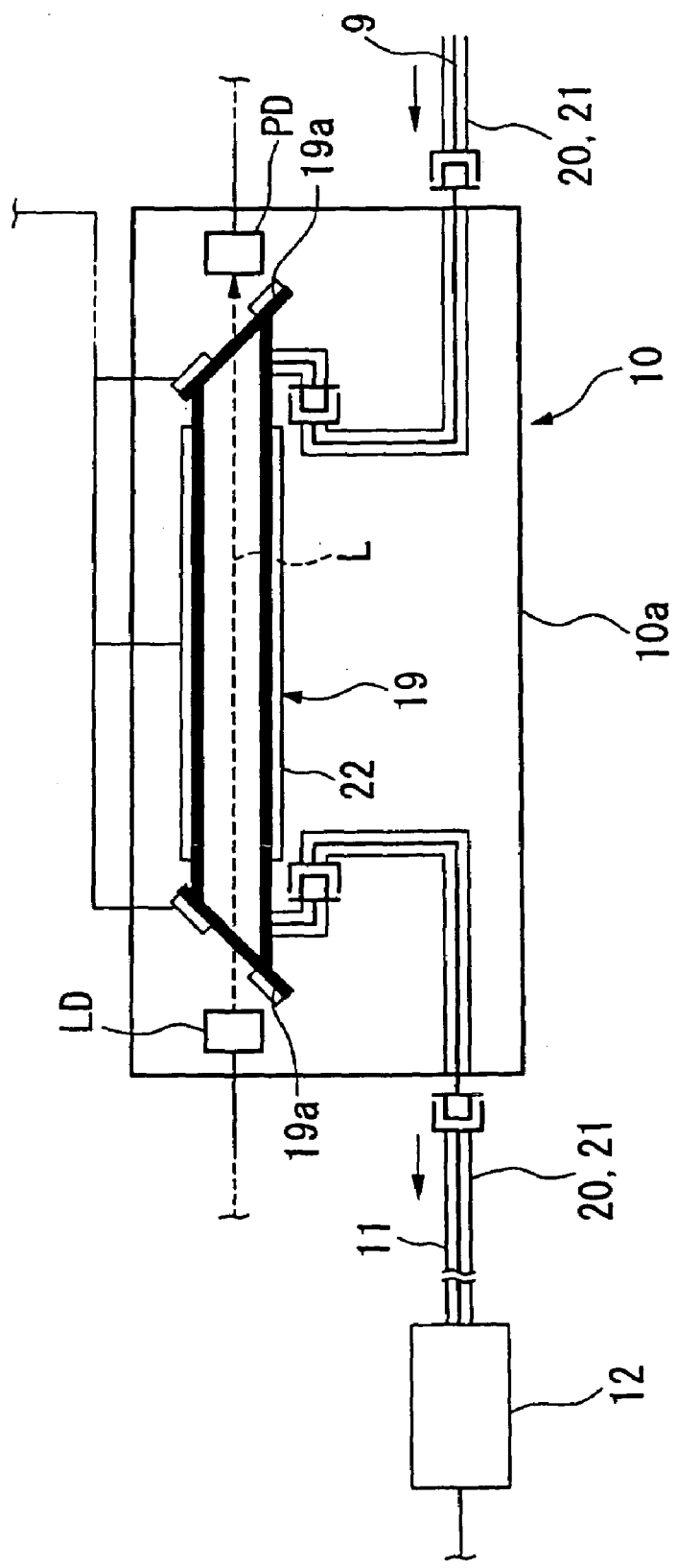
FIG. 2 is a cross-sectional view of the constitution of a moisture measuring device for processing in an embodiment of the semiconductor manufacturing method according to the present invention.

As shown in FIG. 2, the moisture measuring device for processing 5 comprises a sampling pipe 9 which functions as a sample line having one end connected via a valve (not shown) and the gas discharge system of the process chamber 1, a moisture measuring device main body 10 which connects to the other end of the sampling pipe 9 and measures the moisture of the reactive gas from the process chamber 1, and a rotary pump 12 which is connected via a connecting pipe 11 to the rear end of the moisture measuring device main body 10.

A tubular cell main body 19 is provided inside the case 10a of the moisture measuring device main body 10. The sampling pipe 9 (gas discharge system) is connected to one end of the tubular cell main body 19, and the connecting pipe 11 is connected to the other side. Light-permeable windows 19a are provided on both sides of the tubular cell main body 19. A variable-wavelength semiconductor laser LD is provided facing the outside of one light-permeable window 19a, and generates infrared laser light (wavelength 1.3 to 1.55 μm). A photodetector PD is provided facing the outside of the other light-permeable window 19a, and detects the infrared laser light L, which has passed through the tubular cell main body 19, and converts the intensity of the detected light to an electrical signal.

A ribbon heater 20 connects to a current supply source (not shown in FIG. 2) and is wound around the sampling pipe 9 and the connecting pipe 11. A heat insulator 21 of silicon rubber is wound around the ribbon heater 20. The current flowing through in the ribbon heater 20 is adjusted so as to heat the sampling pipe 9 and the connecting pipe 11 to a temperature above 100° C. The ribbon heater 20 reduces secondary reactive products in the pipes.

A heater for cell 22 is attached to the tubular cell main body 19 and the light-permeable windows 19a of the moisture measuring device main body 10, and mainly comprises an electric heating wire which heats the above parts to more than 100° C. The measuring sensitivity of the moisture measuring device main body 10 is adjusted and corrected beforehand in accordance with the temperature of the gas which has been heated to more than 100° C. by the ribbon heater 20 and the heater for cell 22.

Figure 3:
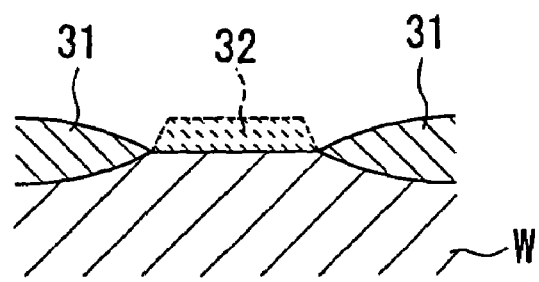
FIG. 3 is a cross-sectional view of a silicon substrate in which the primary parts for selective epitaxial growth are enlarged.

As shown in FIG. 3, the epitaxial crystal growth apparatus is used for selective epitaxial growth of the silicon film 32 (semiconductor film) on the surface of the silicon substrate W, which has the $SiO_2$ film 31 patterned on its surface, only in the region where the silicon is exposed. This embodiment will be explained.

Firstly, the silicon substrate W is inserted from the insertion load lock chamber 3 into the carrying chamber 2, and the atmosphere in the carrying chamber 2 is replaced by an inert gas such as $N_2$. In addition, the carrying system moisture measuring device 6 measures the moisture in the atmosphere. After confirming that the moisture has been sufficiently reduced, the silicon substrate W is delivered into the process chamber 1.

The inside of the process chamber 1 is purged with a purge gas comprising an inert gas such as $H_2$ or $N_2$. After the silicon substrate W is inserted into the process chamber 1, it is baked (heated) to a predetermined temperature. During baking, the rotary pump 12 is activated, the valve and the like of the sampling pipe 9 is opened, and the atmospheric gas inside the process chamber 1 is constantly fed to the moisture measuring device main body 10 while adjusting the amount of flow.

The sampled gas is fed into the tubular cell main body 19 inside the moisture measuring device main body 10, and the semiconductor laser LD radiates infrared laser light L onto the gas. The photodetector PD detects the infrared laser light L which the gas in the tubular cell main body 19 has passed through. The moisture content in the gas is measured based on the strength of the absorption spectrum obtained from the detected light, and the moisture in the gas is quantitatively analyzed. The gas which was injected to the tubular cell main body 19 is discharged via the connecting pipe 11 and the rotary pump 12 to the discharge system. The pressure in the process chamber 1 is constantly measured by the pressure measuring device 7.

Baking conditions are adjusted based on the measured moisture content in the process chamber 1 during baking. The baking conditions comprise the heating temperature of the substrate W, heating time, and amount of purge gas, and at least one of these is adjusted. For example, when the moisture content exceeds an appropriate range, adjustments such as increasing the heating temperature, the heating time, or the amount of purge gas, are made based on the moisture content, thereby keeping the moisture content during baking within the appropriate range. The selectability of the selective growth is improved by increasing the heating temperature or heating time during baking.

After adjusting the baking conditions to keep the moisture content within the appropriate range, a reactive gas such as $SiCl_2H_2$, HCl, $H_2$, and $SiH_4$, is injected so as to selectively grow an epitaxial layer on the surface of the silicon substrate W. As during baking, the moisture content and pressure inside the process chamber 1 is measured constantly during this processing.

Processing conditions are adjusted based on the measured moisture content in the process chamber 1 during baking and processing. The processing conditions comprise the heating temperature of the substrate W, the amount of reactive gas, the mixture ratio of the reactive gas, or pressure inside the process chamber 1, and at least one of these is adjusted. For example, when the moisture content has exceeded an appropriate range, adjustments such as increasing the amount of hydrogen for the source gas (such as $SiCl_2H_2$, HCl, etc.) during processing, increasing the amount of HCl (hydrogen chloride), increasing the pressure inside the process chamber 1, or the like, thereby increasing the selectability of the selective growth. In particular, HCl has the effect of preventing polysilicon from growing on $SiO_2$ (i.e. increasing selectability).

The amount of gas should preferably be set to conditions near the interface between regions where selective growth is possible and nonselectable regions.

The condition settings, which have been preset in accordance with the moisture content, may be stored in a controller or the like of the growth apparatus, so that the controller or the like can automatically adjust the baking conditions and processing conditions based on the measured moisture content.

After the epitaxial growth is completed, the inside of the process chamber 1 is replaced by inert gas, and the post-selective growth silicon substrate W is ejected from the ejection load lock chamber 4 via the carrying chamber 2.

In this embodiment, the moisture content inside the process chamber 1 is measured while the silicon substrate W is in place, and the gas processing conditions for the selective epitaxial growth are adjusted based on the moisture content. Therefore, the moisture content during baking can be kept within an appropriate range by using the actual measurement of the moisture content. Moreover, processing conditions during selective growth are adjusted. Consequently, selective epitaxial growth can be achieved with stability and high precision and with due consideration to the effect of moisture content on the selectability of the selective growth.

The first aspect of this invention also comprises the following embodiments.

The embodiment described above is applied in a semiconductor manufacturing method which achieves selective epitaxial growth by vapor deposition. However, this invention basically executes the processes of making a reactive gas react with a substrate inside a reaction chamber, and may be used in other semiconductor manufacturing methods where processing characteristics are affected by the moisture content. For example, this invention may be applied in a method for manufacturing an epitaxial wafer by vapor deposition of a single-crystal silicon thin-film on a silicon substrate having extremely low resistivity, which is to be used as a substrate for a MOS device, or in other methods for providing a thin-film on a substrate, such as CVD, or in dry etching the surface of a substrate by using reactive gas.

Subsequently, the semiconductor manufacturing method according to a second aspect of this invention, and an embodiment of the semiconductor manufacturing apparatus according to a third aspect of this invention, will be explained with reference to FIGS. 4 to 6.

In the explanation of these aspects, members which have the same function as those described in the semiconductor manufacturing method according to the first aspect of this invention are represented by the same reference codes.

Figure 4:
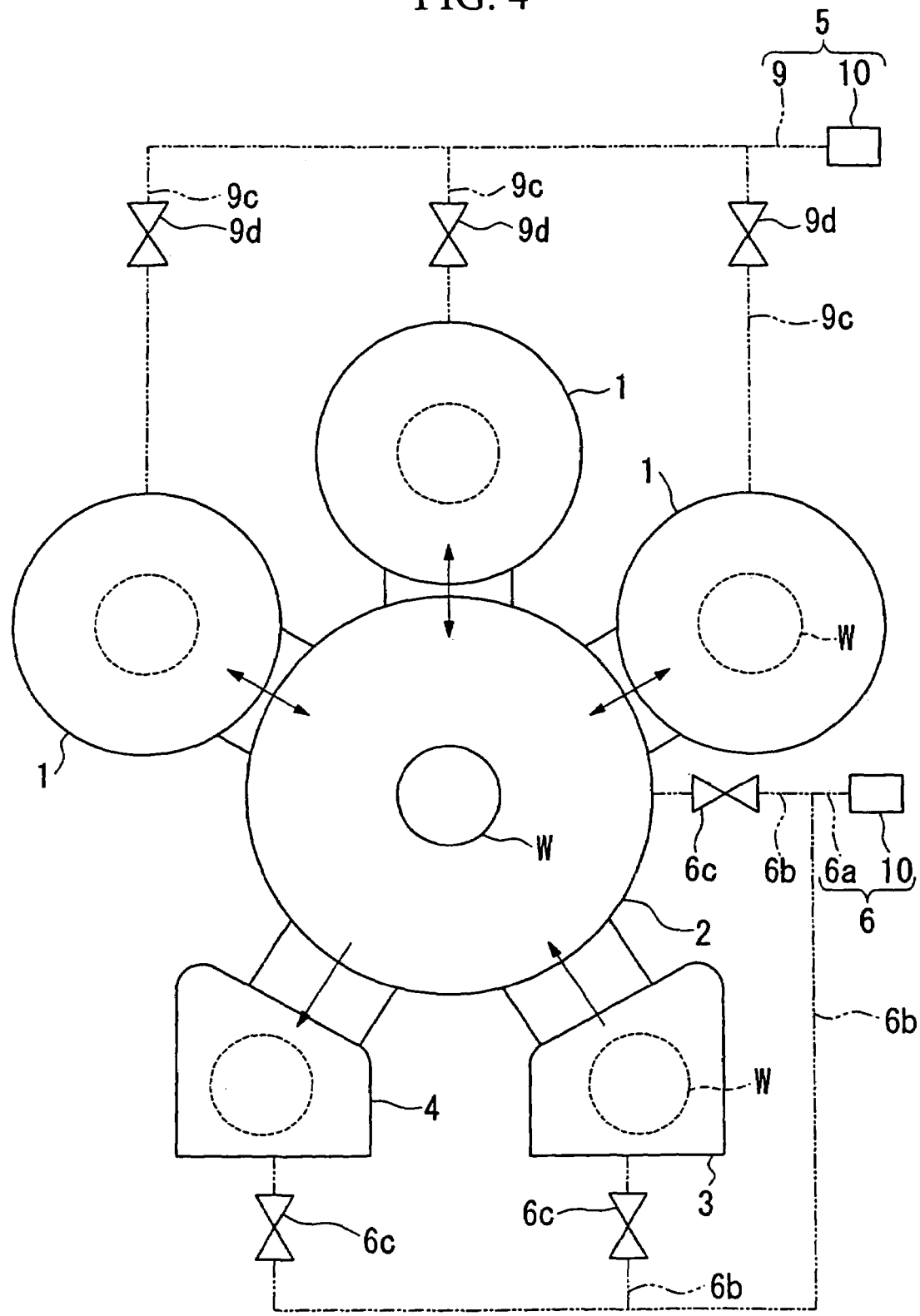
FIG. 4 is a schematic overall plan view of an epitaxial crystal growth apparatus in an embodiment of the semiconductor manufacturing method and the semiconductor manufacturing apparatus according to the present invention.
Figure 5:
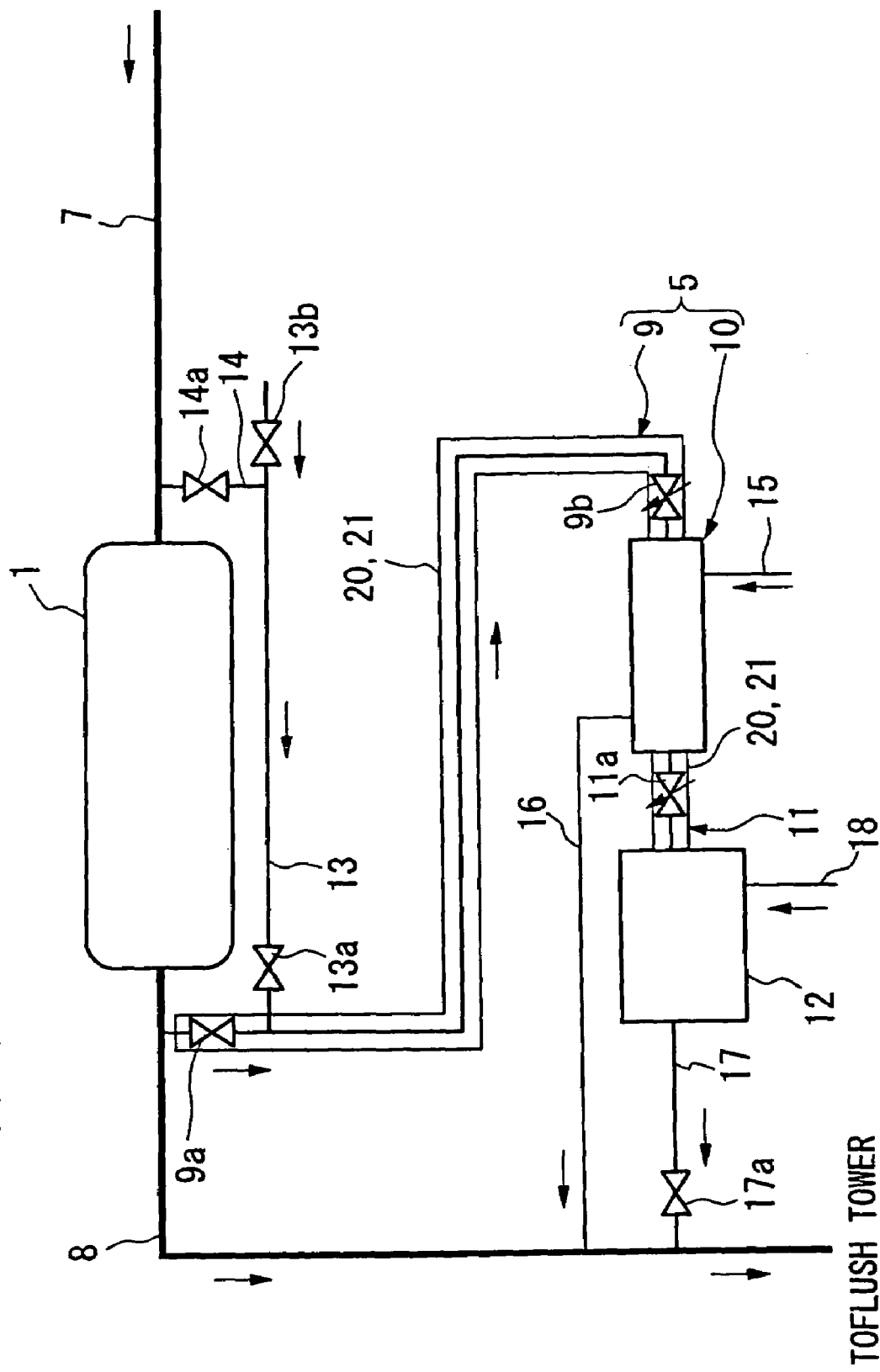
FIG. 5 is a pipe diagram showing the constitution of the moisture measuring device for processing in an embodiment of the semiconductor manufacturing method and the semiconductor manufacturing apparatus according to the present invention.
Figure 6:
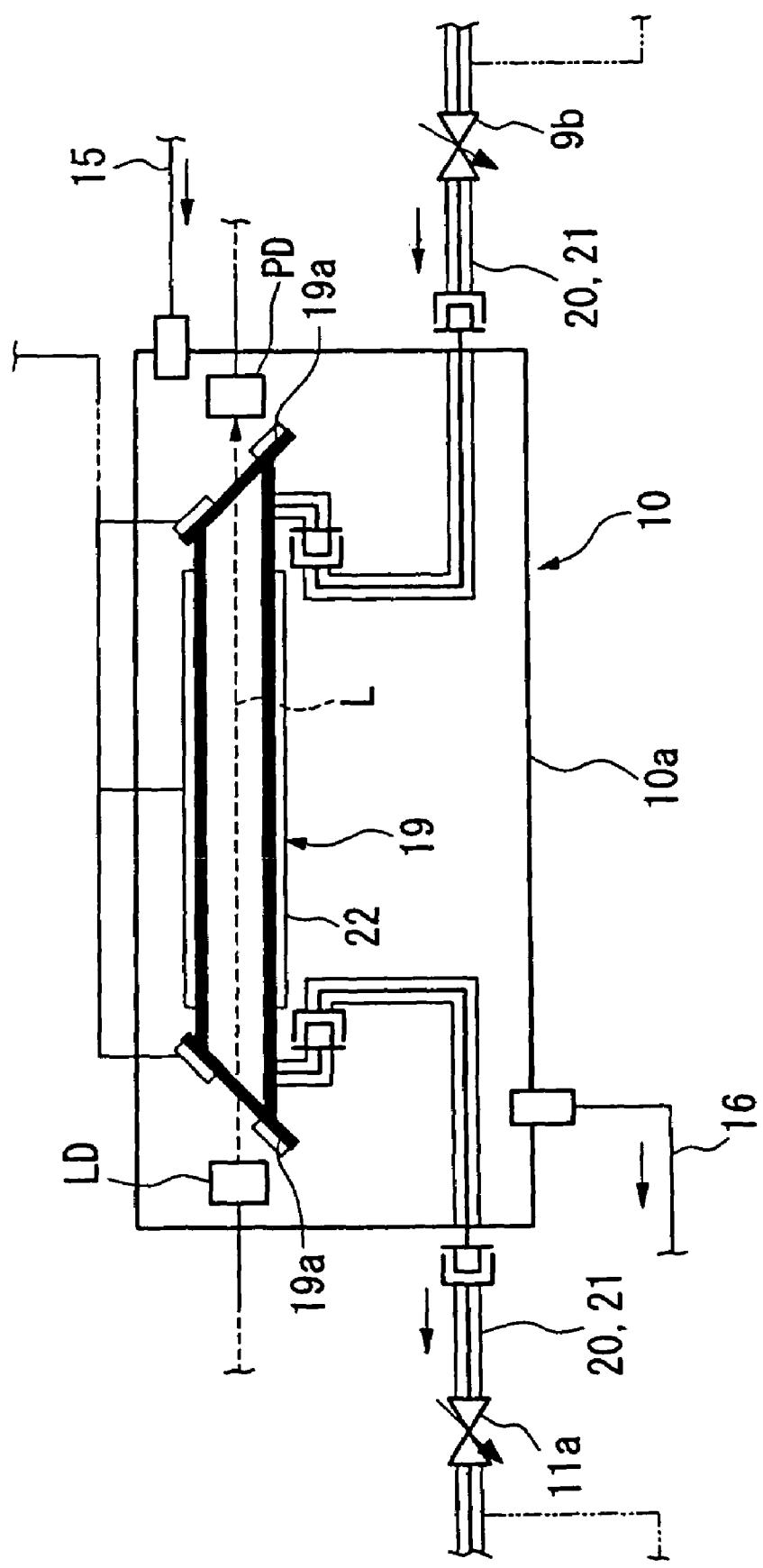
FIG. 6 is a cross-sectional view of the constitution of a laser moisture measuring device for processing in an embodiment of the semiconductor manufacturing method and the semiconductor manufacturing apparatus according to the present invention.
Figure 9:
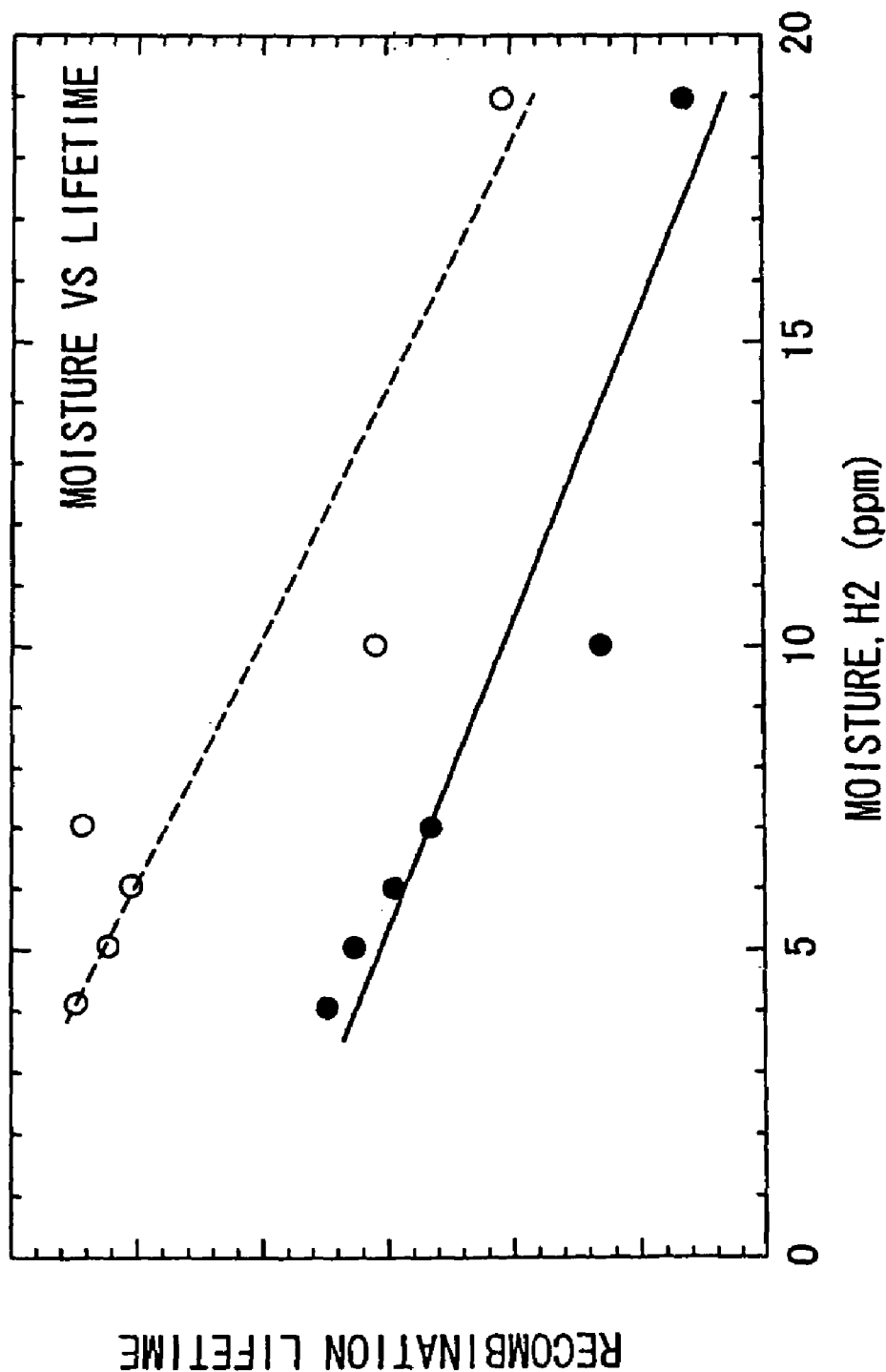
FIG. 9 is a graph showing the relationship between moisture in discharged gas and lifetime.
Figure 10:
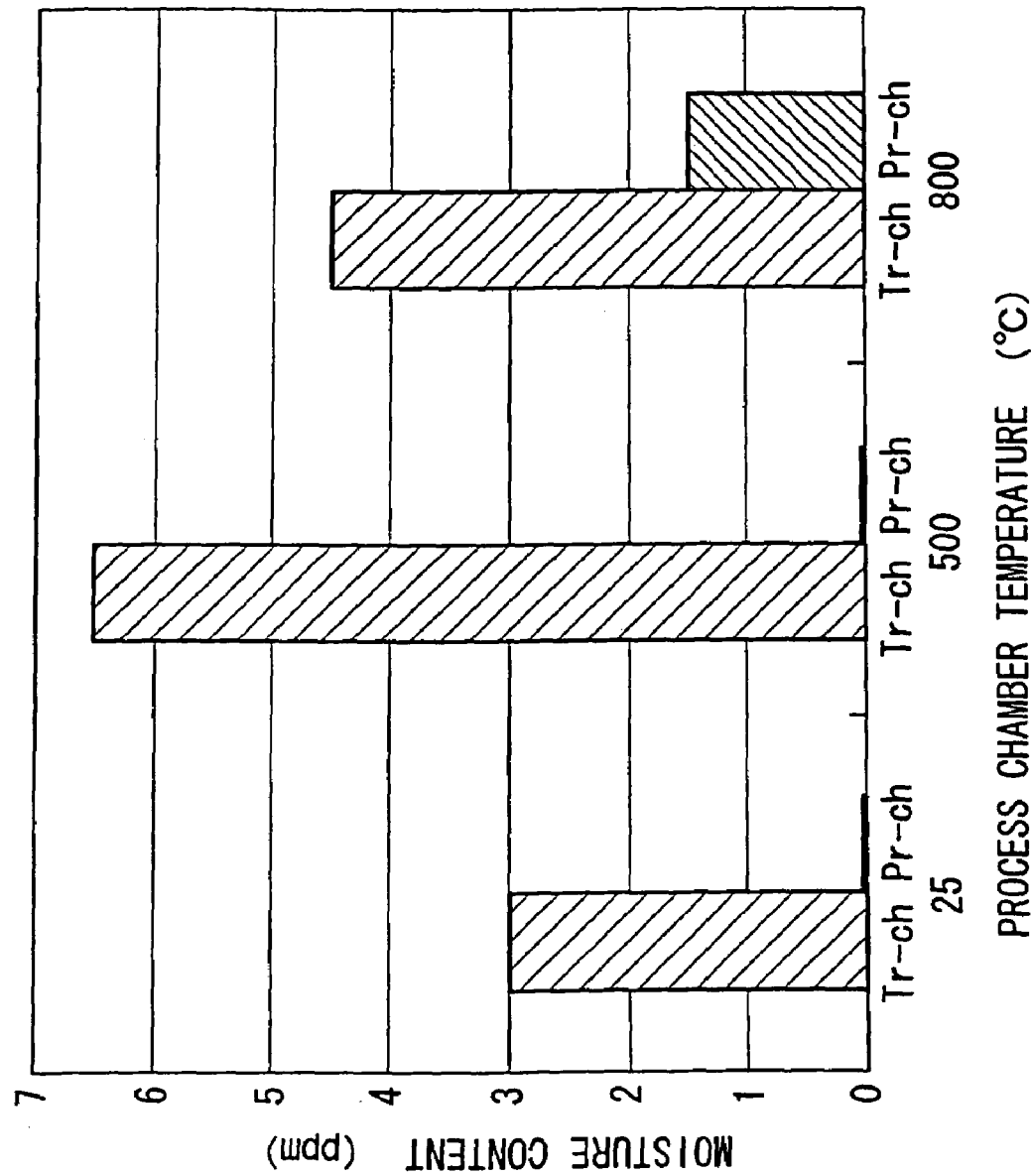
FIG. 10 is a graph showing the relationship between moisture contents in a carrying chamber and a process chamber and process chamber temperature.

In FIGS. 4 to 6, reference numeral 1 represents process chambers, 2 represents a carrying chamber, 3 represents an insertion load lock chamber, 4 represents an ejection load lock chamber, 5 represents a moisture measuring device for processing, and 6 represents a carrying system moisture measuring device.

FIG. 4 shows an example where the semiconductor manufacturing method of the third aspect of this invention is applied in a leaf-type epitaxial crystal growth apparatus. As shown in FIG. 4, the epitaxial crystal growth apparatus is a multi-chamber growth apparatus and comprises three quartz process chambers (reaction chambers) 1, comprising hollow-body airtight enclosures inside which silicon substrates (substrate) W are placed, a carrying chamber (substrate carrying system) 2 having an inner gastight space whose atmosphere is replaced when the silicon substrates W are inserted into the process chambers 1, an insertion load lock chamber 3 which inserts the pre-process silicon substrates W into the carrying chamber 2, and an ejection load lock chamber 4 which extracts the processed silicon substrates W from the carrying chamber 2.

The process chambers 1 are connected by a sampling pipe for processing 9 to a moisture measuring device for processing (second moisture measuring device) 5 which samples the process gas comprising reactive gas (corrosive gas), which has been injected into the process chamber 1, and measures the moisture therein.

The carrying system moisture measuring device (first moisture measuring device) 6 is connected by a carrying system sampling pipe 6a to the inner sections of the carrying chamber 2, the insertion load lock chamber 3, and the extraction load lock chamber 4, and measures the moisture of the atmosphere therein. The carrying system moisture measuring device 6 is identical to the moisture measuring device for processing 5 which uses a high-precision rapid-response laser moisture measuring device main body 10 explained later.

The carrying system sampling pipe 6a comprises three branch pipes 6b which lead from the laser moisture measuring device main body 10 to the carrying chamber 2, the insertion load lock chamber 3, and the extraction load lock chamber 4. A valve 6c is provided to each branch pipe 6a and can open and close them.

As shown in FIG. 5, a process gas injection pipe 7 is connected to the process chambers 1 and allows gas (SiC 12H2, SiC13H, HC1, H2, N2, B2H6, PH3, etc.) to be injected therein. A process gas exhaust pipe 8 is connected to the process chambers 1 and discharges the reactive gas and the like to an exhaust gas processing unit (not shown) after reaction inside the process chambers 1.

The moisture measuring device for processing 5 comprises a sampling pipe for processing 9 which functions as a sample line having a valve 9a at one end which connects via a process gas exhaust pipe to the process chamber 1, a laser moisture measuring device main body 10 which connects via a variable valve 9b to the other end of the sampling pipe for processing 9 and measures the moisture of the reactive gas from the process chamber 1, and a rotary pump 12 which is connected by a connecting pipe 11 via a variable valve 11a to the rear end of the laser moisture measuring device main body 10.

A pipe purging line 13 for sample line N2 purging connects via a valve 13a to the base of the sampling pipe for processing 9. A process gas injection pipe 7 is connected by a branch pipe 14 via a valve 14a to the pipe purging line 13. The pipe purging line 13 comprises a valve 13b at a position further upstream from the connection with the branch pipe 14.

The sampling pipe for processing 9 branches into three branch pipes 9c in correspondence with the three process chambers 1 from the laser moisture measuring device main body 10. Valves (switching mechanisms) 9d are provided to each of the branch pipes 9c and can open and close them.

As shown in FIGS. 5 and 6, a case purge line 15 for N2 purging the inside of the case 10a is connected to the laser moisture measuring device main body 10. In addition, an N2 discharge line 16 for discharging the N2 is connected to the laser moisture measuring device main body 10. The other end of the N2 discharge line 16 connects to the process gas exhaust pipe 8.

A sampling exhaust pipe 17 connects the rotary pump 12 via a valve 17a to the process gas exhaust pipe 8. An $N_2$ purge line for gas ballast 18 is connected to the rotary pump 12.

As shown in FIG. 6, the laser moisture measuring device main body 10 comprises a tubular cell main body 19 inside a case 10a. The sampling pipe for processing 9 connects to one end of the tubular cell main body 19, and the connecting pipe 11 connects to the other side. Light-permeable windows 19a are provided on both sides of the tubular cell main body 19. A variable-wavelength semiconductor laser LD is provided facing the outside of one light-permeable window 19a, and radiates infrared laser light (wavelength 1.3 to 1.55 µm). A photodetector PD is provided facing the outside of the other light-permeable window 19a, and detects the infrared laser light L, which has passed through the tubular cell main body 19, and converts the intensity of the detected light to an electrical signal.

A ribbon heater 20 is wound around the sampling pipe for processing 9 and the connecting pipe 11, and a heat insulator 21 of silicon rubber is wound around the ribbon heater 20. The ribbon heater 20 connects to a current supply source (not shown in FIG. 2). The current flowing through in the ribbon heater 20 is adjusted so as to heat the sampling pipe for processing 9 and the connecting pipe 11 to a temperature above 100° C.

A heater for cell 22 is attached to the tubular cell main body 19 and the light-permeable windows 19a of the moisture measuring device main body 10, and mainly comprises an electric heating line which heats the above parts to more than 100° C. The carrying system sampling pipe 6a is heated in the same way as the sampling pipe for processing 9. As a consequence, it is possible to reduce secondary reactive products in the pipes of the process chamber 1 where the reactive gas has been heated, and thereby prevent the secondary reactive products from blocking the pipes. Therefore, the moisture can be constantly measured in situ.

The measuring sensitivity of the moisture measuring device main body 10 is adjusted and corrected beforehand in accordance with the temperature of the gas which has been heated to more than 100° C. by the ribbon heater 20 and the heater for cell 22. The measuring sensitivity is adjusted and corrected by, for example, a controller (not shown) which is connected to the photodetector PD and processes a signal therefrom by calculation.

Stainless pipes are used as the pipes mentioned above, and the inner faces of the pipes are electro-polished or, more preferably, CRP passivated (i.e. an immovable film having a chromium oxide film on its top face is provided).

Subsequently, a method for growing epitaxial crystal in the embodiments of the semiconductor manufacturing method according to a second aspect of this invention, and the semiconductor manufacturing apparatus according to a third aspect of this invention, will be explained.

Firstly, the silicon substrate W which the epitaxial crystal is to be grown on is delivered from the outside to the insertion load lock chamber 3. The carrying system moisture measuring device 6 measures the moisture in the insertion load lock chamber 3. Only the valve 6c of the branch pipe 6b connected to the insertion load lock chamber 3 is opened, and the other valve 6c is closed. In this state, the atmosphere inside the insertion load lock chamber 3 is fed via the sampling pipe for carrying system 6a to the laser moisture measuring device main body 10, and the moisture content in the atmosphere is measured. The gas is fed from the sampling pipe for carrying system 6a to the laser moisture measuring device main body 10 in the same manner as the moisture measuring device for processing 5 which will be explained later.

Based on the measurement taken by the carrying system moisture measuring device 6, it is confirmed that the moisture content in the insertion load lock chamber 3 is below a predetermined value. Thereafter, the silicon substrate W is inserted from the insertion load lock chamber 3 to the carrying chamber 2, and the atmosphere in the carrying chamber 2 is replaced by an inert gas, such as $N_2$.

The carrying system moisture measuring device 6 measures the moisture in the carrying chamber 2. Only the valve 6c of the branch pipe 6b connected to the carrying chamber 2 is opened, and the other valve 6c is closed. In this state, the atmosphere inside the carrying chamber 2 is fed via the sampling pipe for carrying 6a to the laser moisture measuring device main body 10, and the moisture content in the atmosphere is measured. Based on the measurement taken by the carrying system moisture measuring device 6, it is confirmed that the moisture content in the carrying chamber 2 is below a predetermined default value (first default value). Thereafter, the silicon substrate W is carried into the process chamber 1. The predetermined default value depends on the capacity ratio between the carrying chamber 2 and the process chamber 1, but should ideally be less than 5 ppm. Even when the moisture content is slightly high, it is purged by the purge gas and has no adverse effect.

Before processing, the inside of the process chamber 1 is purged with an inert gas such as $H_2$ or $N_2$. The silicon substrate W is inserted from the carrying chamber 2, and heated to a predetermined temperature. The moisture measuring device for processing 5 measures the moisture in the process chamber 1. Only the valve 9d of the branch pipe 9c connected to the process chamber 1 is opened, and the other valve 9d is closed. In this state, the gas inside the process chamber 1 is fed via the sampling pipe for processing 9 to the laser moisture measuring device main body 10, and the moisture content in the gas is measured. The valve 9a and 17a are opened, and the rotary pump 12 is activated. Some of the gas in the process chamber 1 is constantly fed via the sampling pipe for processing 9 to the laser moisture measuring device main body 10, while adjusting the amount by using the variable valves 9b and 11a.

The gas which has been sampled is fed into the tubular cell main body 19 in the laser moisture measuring device main body 10, and the semiconductor laser LD radiates infrared laser light L onto the gas. The infrared laser light L which has been transmitted through the gas in the tubular cell main body 19 is detected by the photodetector PD, and moisture in the gas is quantitatively analyzed based on the strength of the absorption spectrum obtained from the amount of detected light.

After it has been confirmed that the moisture content in the sampled gas is less then at least 1 ppm (a second default value), the valves 13a, 13b, and 14a are closed, and a predetermined reactive gas or the like is fed through a processed gas feeding pipe 23 to grow an epitaxial layer on the surface of the silicon substrate W. In the case where there is oxygen inside the carrying chamber 2 and the gas in the process chamber 1 is hydrogen, moisture will be generated by the reaction at a certain temperature. Therefore, in this case, processing is cancelled and the apparatus undergoes maintenance to check for leaks and the like in the carrying system.

The reactive gas and the like fed to the tubular cell main body 19 is discharged via the connecting pipe 11, the rotary pump 12, and the sampling exhaust pipe 17, to the process gas exhaust pipe 8.

During epitaxial growth, some of the exhaust gas which reacted and was heated in the process chamber 1 is constantly fed via the sampling pipe for processing 9 to the laser moisture measuring device main body 10, which measures the moisture content of the exhaust gas.

After completion of the epitaxial growth, the substrate W is returned from the process chamber 1 to the carrying chamber 2. Then, the substrate W is ejected to the extraction load lock chamber 4 and extracted to the outside. The moisture content in the extraction load lock chamber 4 can also be measured by the carrying system moisture measuring device 6 by switching the open/closed state of the valve 6c, making it possible to detect leaks and the like in the extraction load lock chamber 4.

In this embodiment, the carrying system moisture measuring device 6 measures the moisture content in the airtight space of the carrying chamber 2, and the moisture measuring device for processing 5 measures the moisture content in the process chamber 1. This enables the moisture content in the substrate carrying system, comprising the insertion load lock chamber 3, the carrying chamber 2, and the like, to be measured together with the moisture content in the process chamber 1. Therefore, it is possible to investigate the effects of moisture content in the airtight space of the substrate carrying system on the moisture content of the process chamber 1. The moisture contents of the carrying chamber 2 and the insertion load lock chamber 3 can be measured individually by the carrying system moisture measuring device 6. Consequently, it is also possible to investigate the effects of the moisture content in the insertion load lock chamber 3 on the moisture content in the carrying chamber 2.

Prior to transporting the substrate W to the process chamber 1, the moisture content in the insertion load lock chamber 3 and the carrying chamber 2 is measured and controlled to a predetermined content in order to reduce moisture content in the process chamber 1. Therefore, it is possible to greatly reduce an increase in the moisture content which is caused by gas inside the substrate carrying system seeping into the process chamber 1, achieving excellent epitaxial growth. Even when oxygen has penetrated the substrate carrying system, the moisture content in the process chamber 1 increases, thereby making it possible to achieve excellent epitaxial growth.

The epitaxial layer is grown on the surface of the silicon substrate W by injecting reactive gas after at least confirming that the moisture content of the sampled gas is less than 1 ppm. Consequently, spots of heavy metal pollution can be prevented.

The moisture measuring device for processing can measure the individual moisture contents of the process chambers 1. Therefore, defects and malfunctions can easily be judged when measuring the moisture content of each process chamber 1 reveals that the moisture content in one/some of the process chambers 1 has increased.

The valves 9d make it possible to switch the object connected to the moisture measuring device for processing 5 to a predetermined process chamber 1. Therefore, the process chamber 1 to be measured can be connected to the laser moisture measuring device main body 10 by opening/closing the relevant valve 9d, and a single moisture measuring device for processing 5 can be used to measure the moisture content in multiple and predetermined process chambers 1. This reduces the number of components and the cost.

Second and third aspects of this invention comprise the following embodiments.

In the embodiments described above, the moisture measuring device for processing 5 and the carrying system moisture measuring device 6 are provided separately. However, by branching the sampling pipe from a single moisture measuring device to the process chamber and the substrate carrying system, such as the carrying chamber, the single moisture measuring device can function simultaneously as a measuring device for processing and a measuring device for the carrying system. The connected object can be switched to the airtight space of the substrate carrying system or the process chamber by using the valves and the like. In this case, the moisture content of the airtight space of the substrate carrying system and the process chamber can be measured by a single moisture measuring device, reducing the number of components and the cost.

The embodiments already described apply this invention in inserting a silicon substrate W from the carrying chamber 2 to the process chamber 1. However, this invention may be applied in ejecting the silicon substrate W from the process chamber 1 to the carrying chamber 2 after epitaxial growth has been completed. For example, an epitaxial layer is grown on the surface of a silicon wafer W inside the process chamber 1 by using a gas such as monosilane, and, after the growth has been completed, the silicon wafer W is ejected from the process chamber 1 to the carrying chamber 2. Thereafter, HCl is injected into the process chamber 1 for cleaning (etching). In this case, the moisture content in the carrying chamber 2 is measured prior to ejecting the wafer W. The wafer W is ejected to the carrying chamber 2 only after it has been confirmed that the moisture content in the carrying chamber 2 is below a default value (e.g. 5 ppm). By confirming the moisture content in the carrying chamber 2 before ejection in this way, it is possible to greatly reduce the amount of gas in the carrying chamber 2 which seeps into the process chamber 1 during ejection and increases the moisture content therein. This achieves excellent HCl cleaning.

The carrying system moisture measuring device 6 of the embodiments described above should preferably be the same as the moisture measuring device for processing 5 which uses the high-precision laser moisture measuring device main body 10. However, it is acceptable to use an absorbant moisture measuring device for measuring the amount of fluctuation in the oscillating frequency of a liquid crystal vibrator which is coated with a moisture-absorbant thin-film, an electrostatic capacity moisture measuring device for measuring changes in the electrical capacitance in moisture absorbed in an alumina capacitor, a moisture measuring device using qualitative analysis, and such like.

In the embodiments described above, the semiconductor manufacturing apparatus is applied in a vapor deposition apparatus which grows an epitaxial layer, but this invention may also be applied in other semiconductor manufacturing apparatuses where a reactive gas is reacted with a substrate inside a reaction chamber. For example, this invention may be applied in a CVD apparatus which provides a thin-film on a substrate, a dry etching apparatus which etches the substrate surface by using corrosive gas, and the like.

In the above embodiments, this invention is applied in a single wafer processing-type epitaxial growth apparatus, but is not restricted to this and may be applied in other types of apparatus (various batch-types, etc.).

Furthermore, a corrosive gas comprising a reactive gas is fed into the pipes and process chambers after they have been purged with $H_2$, but further purging with HCl (hydrogen chloride) may be carried out after adequate purging with $H_2$. Thereafter, the reactive gas for growth is injected. In this case, the moisture molecules on the walls of the pipes and the process chambers combine with the HCl molecules and are thereby carried away, reducing the moisture entering the reactive gas which is subsequently injected.

By way of a comparison, epitaxial layers were grown on silicon wafers W by using a conventional method (moisture content of 4 ppm) and the method according to the above embodiment (moisture content of 1 ppm). The results obtained are shown respectively in FIGS. 7 and 8. Regions on the surface of the wafer W where the lifetime is less than 500 µs (corresponding to heavy metal pollution) are shown by diagonal shading.

Figure 7:
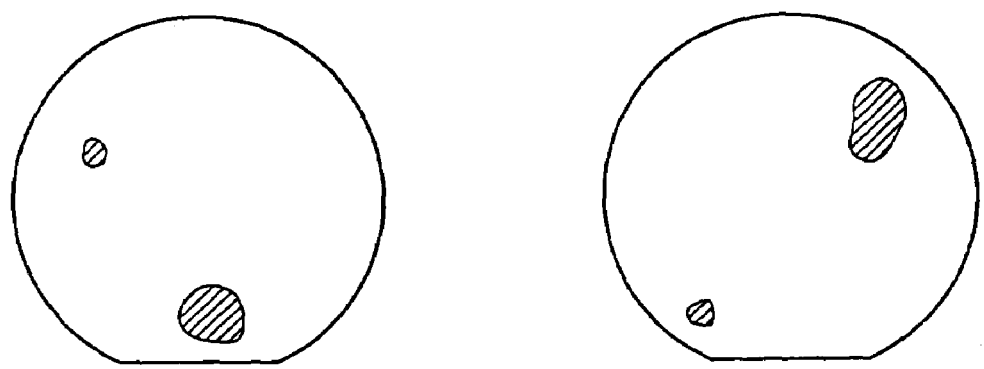
FIG. 7 is a distribution diagram showing the state of heavy metal pollution on the face of a wafer when an epitaxial layer is actually grown by using a conventional semiconductor manufacturing method and a conventional semiconductor manufacturing apparatus.
Figure 8:
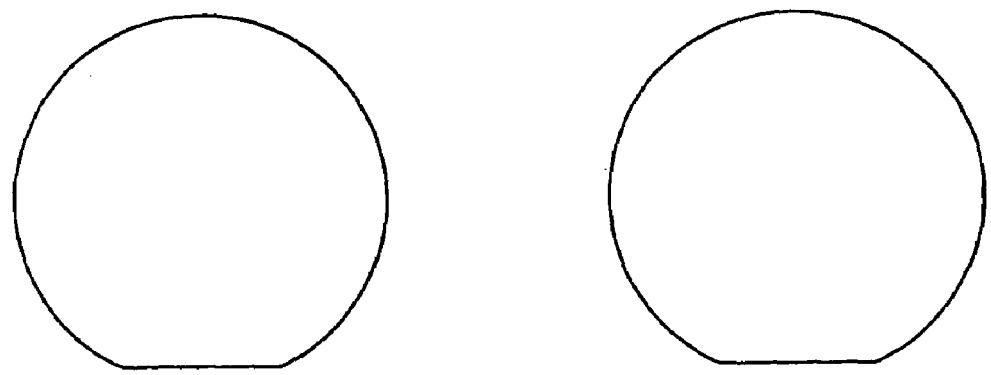
FIG. 8 is a distribution diagram showing the state of heavy metal pollution on the face of a wafer when an epitaxial layer is actually grown by using the semiconductor manufacturing method and semiconductor manufacturing apparatus according to the present invention.

As is clear from FIGS. 7 and 8, the conventional method results in spots of heavy metal pollution on the surface of the wafer W. By contrast, no spots of pollution are generated by the embodiment of this invention.

What is claimed is:

1. A semiconductor manufacturing method which performs reactive gas processing, wherein, when a substrate carrying system inserts a substrate from an airtight space in the substrate carrying system into a reaction chamber, and when the substrate is ejected from the reaction chamber to the airtight space, a reactive gas is fed into the reaction chamber and reacts therein, the method comprising:
    a substrate carrying step of measuring the moisture content in the airtight space by a first moisture measuring device connected to the airtight space;
    inserting the substrate from the airtight space in the substrate carrying system into the reaction chamber, or ejecting the substrate from the reaction chamber into the airtight space in the substrate carrying system; and
    a gas processing step of performing a reactive-gas-process while measuring the moisture content in the reaction chamber by second moisture measuring device connected to the reaction chamber, after the substrate carrying step, wherein
    in the substrate carrying step, after it has been confirmed that the moisture content in the airtight space is lower than a first default value, the substrate is inserted from the airtight space into the reaction chamber, and the substrate is ejected from the reaction chamber to the airtight space; and
    in the gas processing step, the reactive-gas-process starts after it has been confirmed that the moisture content in the reaction chamber is lower than a second default value.

2. The semiconductor manufacturing method according to claim 1, at least said second default value being lower than 1 ppm.

3. The semiconductor manufacturing method according to claim 1, at least one of the first moisture measuring device and the second moisture measuring device comprising a laser moisture measuring device which radiates laser light into a tubular cell main body, connected to the airtight space and the reaction chamber, and measures an absorption spectrum of transmitted laser light.

4. The semiconductor manufacturing method according to claim 1 wherein the measurement of the moisture in the substrate carrying system is conducted in accordance with: an absorbant moisture measuring method; an electrostatic capacity moisture measuring method; or a qualitative analysis method.

5. The semiconductor manufacturing method according to claim 1 wherein the first default value of the moisture in the substrate carrying system is less than 5 ppm.

6. The semiconductor manufacturing method according to claim 1 wherein the first default value of the moisture in the substrate carrying system is less than 5 ppm.

7. A semiconductor manufacturing method for conducting a reactive-gas-process and measuring moisture content in a semiconductor manufacturing device, the semiconductor manufacturing device provided with an insertion load lock chamber, an ejection load lock chamber, a substrate carrying system having a carrying chamber and an inner gastight space, and a plurality of process chambers for receiving substrates from the substrate carrying system, the method comprising:

measuring the moisture content in an inert gas in the insertion load lock chamber when the substrates are inserted into the insertion load lock chamber;

inserting the substrates into the carrying chamber and measuring the moisture content in the inert gas in the carrying chamber only when the measured moisture content in the inert gas in the insertion load lock chamber is less than a predetermined value;

inserting the substrates into the process chambers and measuring the moisture content in the inert gas in the process chambers only when the measured moisture content in the inert gas in the carrying chamber is less than a first default value;

introducing a process gas law the process chambers and conducting epitaxial growth on the substrates only when the measured moisture content in the inert gas in the process chambers is less than a second default value;

measuring the moisture content in the process gas exhausted from the process chamber after conducting the epitaxial growth; and measuring the moisture content in the inert gas in the ejection load lock chamber when the substrates are introduced into the ejection load lock chamber from the process chambers through the carrying chamber after conducting the epitaxial growth.

8. The method according to claim 7 wherein the first default value of the moisture content in the inert gas in the carrying chamber is 5 ppm, and the second default value of the moisture content in the inert gas in the process chamber is 1 ppm.

* * * * *

UNITED STATES PATENT AND TRADEMARK OFFICE
CERTIFICATE OF CORRECTION

PATENT NO. : 7,033,843 B2
APPLICATION NO. : 10/696702
DATED : April 25, 2006
INVENTOR(S) : Hasegawa et al.

It is certified that error appears in the above-identified patent and that said Letters Patent is hereby corrected as shown below:

On The Title Page, Item (73) should read
--(73)     Assignee:     Mitsubishi Materials Silicon Corporation
Tokyo (JP)

Taiyo Nippon Sanso Corporation
Tokyo (JP)--

Signed and Sealed this

Nineteenth Day of December, 2006

JON W. DUDAS
*Director of the United States Patent and Trademark Office*